(12) United States Patent
Eto

(10) Patent No.: US 8,615,871 B2
(45) Date of Patent: Dec. 31, 2013

(54) CHIP MOUNTED WIRING SUBSTRATE

(75) Inventor: Isao Eto, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 301 days.

(21) Appl. No.: 12/967,427

(22) Filed: Dec. 14, 2010

(65) Prior Publication Data

US 2011/0146067 A1   Jun. 23, 2011

(30) Foreign Application Priority Data

Dec. 21, 2009   (JP) ................... 2009-289276

(51) Int. Cl.
*H05K 3/30*   (2006.01)

(52) U.S. Cl.
USPC ............. 29/832; 29/825; 29/840; 349/139; 349/149

(58) Field of Classification Search
USPC .............. 29/825, 832, 840; 349/139, 149
See application file for complete search history.

(56) References Cited

U.S. PATENT DOCUMENTS

| | | | |
|---|---|---|---|
| 4,721,365 A * | 1/1988 | Nishimura ............. | 349/152 |
| 5,386,309 A * | 1/1995 | Nam ...................... | 349/149 |
| 5,729,317 A * | 3/1998 | Izumi .................... | 349/153 |
| 6,266,119 B1 * | 7/2001 | Takahashi et al. ..... | 349/149 |
| 6,867,841 B2 * | 3/2005 | Nakasu et al. ........ | 349/187 |
| 7,236,624 B2 * | 6/2007 | Ohazama ............... | 382/141 |
| 7,751,016 B2 * | 7/2010 | Abe et al. .............. | 349/150 |
| 2007/0246836 A1 | 10/2007 | Ichiyama ............... | 257/778 |

FOREIGN PATENT DOCUMENTS

| | | |
|---|---|---|
| EP | 2 237 101 A1 | 10/2010 |
| JP | 3-231228 | 10/1991 |
| JP | 5-21515 | 1/1993 |
| JP | 9-218420 | 8/1997 |
| JP | 2003289090 A | 10/2003 |
| JP | 2005251930 A | 9/2005 |
| JP | 2005-284004 | 10/2005 |
| JP | 2007-123344 | 5/2007 |

* cited by examiner

*Primary Examiner* — Carl Arbes
(74) *Attorney, Agent, or Firm* — Morgan, Lewis & Bockius LLP

(57) ABSTRACT

A chip mounted circuit substrate (COF) 4 to be installed on a liquid crystal display panel 1 comprises an arrangement wiring electrodes 42 formed on a base film 41 at a first pitch P1 in a first direction (A-direction) and two of first positioning marks 43 formed at both sides of the arrangement of the wiring electrodes 43 in the first direction. Before installing the COF 4 on the liquid crystal display panel 1 by thermo-compression bonding, the first pitch P1 of the wiring electrodes 42 is selected to be narrower than a second pitch P2 after performing the thermo-compression bonding in consideration with expansion of the base film 41 in the first direction. In addition, a part of each the first positioning mark 43 overlaps a second positioning mark 12 formed on the liquid crystal display panel 1 and protrudes outward from the second positioning mark 12 in the first direction.

10 Claims, 3 Drawing Sheets

CHIP MOUNTED WIRING SUBSTRATE

BACKGROUND OF THE INVENTION

1. Field of the Invention

The present invention relates to a liquid crystal display apparatus and a chip mounted wiring substrate suitable for the liquid crystal display apparatus.

2. Description of the Related Art

In late years, a chip mounted wiring substrate (or chip-on flexible printed circuit substrate: hereinafter it is abbreviated as COF), which enables the miniaturization of wiring pitch responding to the miniaturization of the pitch of a driver IC, is used for assembling of the liquid crystal display apparatuses. The COF has a flexible printed circuit substrate (FPC) that connection wirings are formed on a base film and a driver IC is mounted on the FPC.

In case of manufacturing the liquid crystal display apparatuses in a factory in large quantities, as described in the prior arts JP 3-231228A, JP 9-218420A or JP 2007-123344A, for example, positioning marks are formed on both of the COF and the liquid crystal display panel, and the COF is fixed on the liquid crystal display panel by thermo-compression bonding or the like with recognizing the positioning marks by an automated machine. Thereby, the liquid crystal display panel and the COF are aligned with high precision. By the way, when really installing the COF to the liquid crystal display panel, it is necessary to superpose wiring electrodes formed on the COF above cell electrodes (transparent electrodes) formed on the liquid crystal display panel. However, the base film of the COF extends in each direction when it is installed by thermo-compression bonding, so that arrangement pitch of the wiring electrodes of the COF before the thermo-compression bonding is selected to be narrower/smaller that the arrangement pitch of the COF after the thermo-compression bonding in consideration of the extension of the base film. When the COF is installed to the liquid crystal display panel by the thermo-compression bonding, the positioning marks on the COF are displaced from the original positions by the extension of the base film. However, since these positioning marks are dummy electrodes which are not actually used as wiring electrode, the existence of the positioning marks causes no problem.

However, when the COF is dismounted from the liquid crystal display panel to repair the liquid crystal display apparatus, the COF must be attached to the liquid crystal display panel again by manual labor of a worker. Specifically, the worker must locate the COF on the liquid crystal display panel so that the positioning marks of the COF are disposed just above the positioning marks of the liquid crystal display panel and performs the thermo-compression bonding with keeping the posture. However, it is really very difficult and takes long time to perform the thermo-compression bonding by manual labor from a practical standpoint. In addition, although the wiring electrodes of the COF are arranged to have equal width and space, the cell electrodes of the liquid crystal display panel are not necessarily arranged to have equal width and space. Thus, if the width of the cell electrodes of the liquid crystal display panel is wider than that of the wiring electrodes of the COF, when the wiring electrodes formed on the COF are located above the cell electrodes of the liquid crystal display panel, the wiring electrodes may be blinded by the cell electrodes. Consequently, it is difficult to judge whether the COF is precisely positioned on the liquid crystal display panel or not by visual check.

In addition, JP 2005-284004A discloses a conventional technology which enables to make a picture frame of a liquid crystal display apparatus narrower. Pitch of the wiring electrodes of the COF is made narrower than that of the wiring electrodes of the liquid crystal display panel, and end portions of the wiring electrodes of the COF and the wiring electrodes of the liquid crystal display panel are respectively arranged on forty-five degree slanted lines, for example. The wiring electrodes of the COF and the wiring electrodes of the liquid crystal display panel are connected by junction circuits arranged in parallel with sides of the liquid crystal display panel. Since this technology is based on the premise that the wiring electrodes of the liquid crystal display panel are arranged to have equal width and space, it cannot solve the above mentioned problems.

SUMMARY OF THE INVENTION

The present invention is conceived to solve the above mentioned problems and purposed to provide a liquid crystal display apparatus and a chip mounted wiring substrate suitable for the liquid crystal display apparatus, which enable to connect the COF and the liquid crystal display panel precisely and easily by manual labor.

A liquid crystal display apparatus in accordance with an aspect of the present invention comprises a liquid crystal display panel, and a plurality of flexible printed circuit substrates which is fixed on the liquid crystal display panel by thermo-compression bonding, wherein the circuit substrate comprises wiring electrodes arranged in a first direction, and two of first positioning marks which are formed at both sides of an arrangement of the wiring electrodes in the first direction;

the liquid crystal display panel comprises electrodes arranged at positions corresponding to the wiring electrodes, and two of second positioning marks formed at positions corresponding to the first positioning marks;

each of the first positioning mark has a stepped portion formed to protrude outward from an arrangement of the electrodes of the liquid crystal display in the first direction; and the first positioning marks and the second positioning marks are formed so that the wiring electrode of the circuit substrate and the electrodes of the liquid crystal display will be connected at predetermined positions after the thermo-compression bonding when quantities of protrusions of the stepped portions of the first positioning marks from the second positioning marks in both sides in the first direction become substantially equal before the thermo-compression bonding.

A chip mounted circuit substrate in accordance with an aspect of the invention comprises:

a plurality of wiring electrodes arranged on a base film at a first pitch in a first direction; and two of first positioning marks formed at both sides of an arrangement of the wiring electrodes in the first direction, wherein in a state before installing the chip mounted circuit substrate on a liquid crystal display panel by thermo-compression bonding, the first pitch of the arrangement of the wiring electrodes is selected to be narrower than a second pitch of the arrangement of the wiring electrodes after installing the chip mounted circuit substrate on the liquid crystal display panel by thermo-compression bonding in consideration with expansion of the base film in the first direction due to the thermo-compression bonding, the first positioning marks are formed so that a part of each the first positioning mark overlaps a second positioning mark formed on the liquid crystal display panel and protrudes outward from the second positioning mark in the first direction, and the portions of the first positioning marks protruding from the second positioning marks are formed to have stepped shapes so that distances in a second direction perpendicular to the first direction between opposing two sides of the stepped shapes in parallel with the first direction become shorter in phase and each step of the stepped shapes is formed at a third pitch in the first direction.

According to such configurations, since two of the first positioning marks of the chip mounted circuit substrate are formed larger to protrude from the second positioning marks of the liquid crystal display panel, the worker can easily position the chip mounted circuit substrate on the liquid crystal display panel before the thermo-compression bonding by disposing the chip mounted circuit substrate on the liquid crystal display panel so that quantities of protrusions of the first positioning marks from the second positioning marks in both sides in the first direction become substantially equal by manual labor with visual observation. Moreover, the first pitch of the arrangement of the wiring electrodes of the chip mounted circuit substrate is made narrower/smaller than the second pitch after installing the chip mounted circuit substrate on the liquid crystal display panel in consideration of expansion of the base film due to the thermo-compression bonding, so that the wiring electrodes can be precisely connected to the transparent electrodes of the liquid crystal display panel.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein.

DETAILED DESCRIPTION OF THE EMBODIMENT

Figure 1:
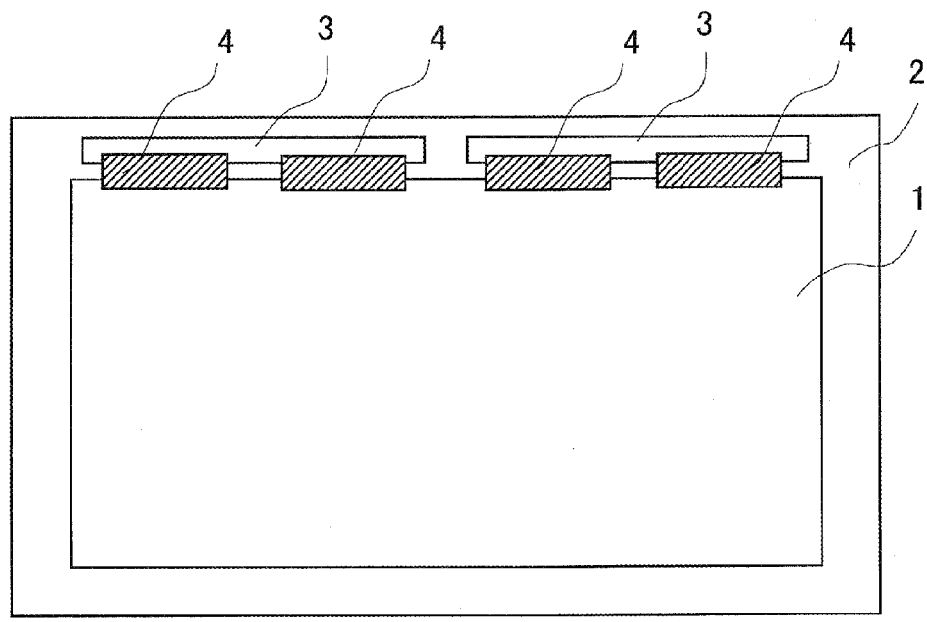
FIG. 1 is a plain view showing a configuration of a liquid crystal display apparatus when an external housing is removed and chip mounted circuit substrates are mounted on a liquid crystal display panel.

An assembling method of a liquid crystal display apparatus and a chip mounted wiring substrate suitable for the method in accordance with an embodiment of the present invention is described with reference to the figures. FIG. 1 shows a state of a liquid crystal display apparatus where an external housing is removed. As can be seen from FIG. 1, an external frame 2 encloses a liquid crystal display panel 1 and circuit boards 3 are held on the external frame 2. A plurality of chip mounted circuit substrates (or chip on flexible printed circuit substrates: hereinafter abbreviated as COF) 4 are used to connect the circuit board 3 and transparent electrodes such as TFT (thin film transistor) formed on a surface of the liquid crystal display panel 1.

Figure 2:
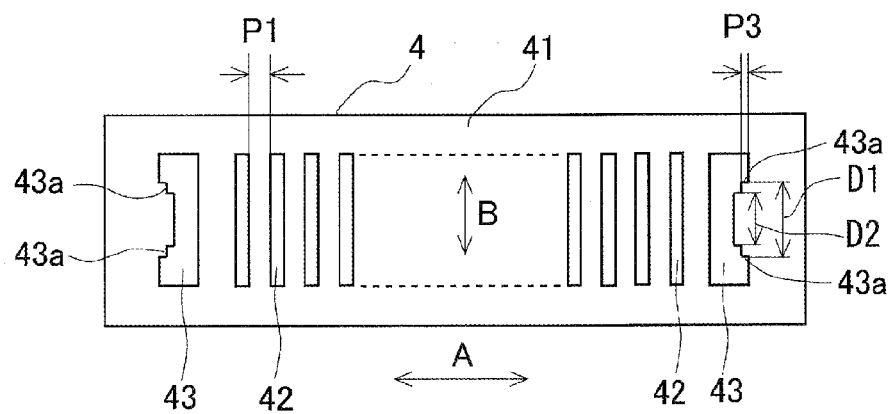
FIG. 2 is a plain view showing a configuration of the chip mounted circuit substrate in accordance with an embodiment of the present invention.

FIG. 2 shows a constitution of the COF 4 in accordance with this embodiment. As shown in FIG. 2, the COF 4 comprises a base film 41, wiring electrodes 42 which are arranged on the base film 41 at a first pitch P1 in a first direction (A-direction), and two of first positioning marks 43 which are formed at positions near to both sides of the arrangement of the wiring electrodes 42 in the first direction. Each wiring electrode 42 has constant dimensions (width and length) in the first direction and a second direction (B-direction) perpendicular to the first direction (A-direction). Since the base film 41 expands in the first direction and in the second direction while thermo-compression bonding is performed, the first pitch P1 before installing the COF 4 on the liquid crystal display panel 1 by the thermo-compression bonding is selected to be narrower (or smaller) than a second pitch P2 (see FIG. 4B) which is the radical pitch of the wiring electrodes 42 after installing the COF 4 on the liquid crystal display panel 1 in consideration of the expansion of the base film 41 in the first direction. In addition, the wiring electrodes 42 and the transparent electrodes 12 which will be described later are schematically illustrated for showing connecting portion of them, and illustration of detailed shapes of them in the second direction is omitted.

The first positioning marks 43 on the COF are dummy electrodes which are not used as wiring electrodes. Each first positioning mark 43 has stepped portions 43a in outer end portion of the first positioning mark 43 opposite to the arrangement of the wiring electrodes 42 in the first direction (A-direction). The stepped portions 43a are formed so that distances D1, D2 in the second direction (B-direction) between opposing two sides of the stepped portions 43a in parallel with the first direction become shorter in phase. In addition, each side of the stepped portions 43a in parallel with the first direction has a length P3. In other words, each step of the stepped portions 43a is formed at a third pitch P3 in the first direction (and in the second direction, if possible). In the example shown in FIG. 2, both outer sides of the first positioning mark 43 in the second direction (B-direction) are formed to be straight lines, and inner sides are formed to have stepped shapes. However, since the stepped portions 43a is sufficient to serve as a kind of scale, it is possible to form the first positioning marks 43 may be formed in converse manner that the stepped portions 43a are formed on outer sides of the first positioning marks 43 in the second direction, for example.

Figure 3:
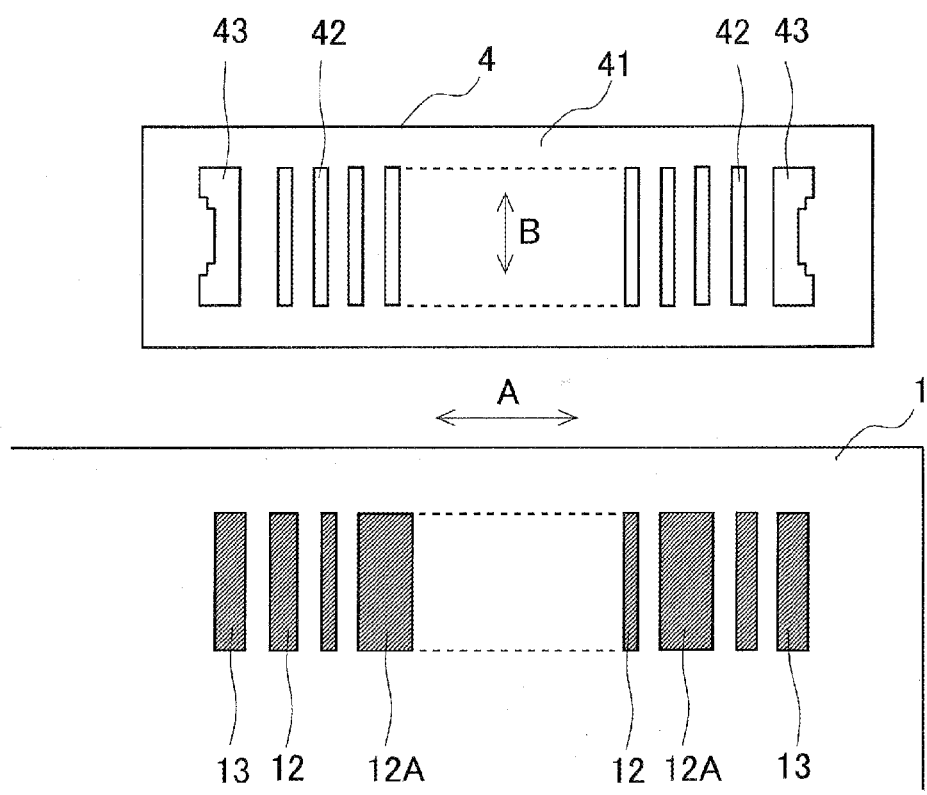
FIG. 3 is a view showing a method to mount the chip mounted circuit substrate on the liquid crystal display panel in a state before thermo-compression bonding process.

FIG. 3 shows a state before installing the COF 4 to the liquid crystal panel 1 by the thermo-compression bonding. On the surface of the liquid crystal display panel 1, transparent electrodes 12 such as TFT and second positioning marks 13 are formed. In addition, when installing the COF 4 on the liquid crystal display panel 1 by the thermo-compression bonding, the liquid crystal display panel 1 hardly expands, and relative positions of the second positioning marks 13 to the transparent electrodes 12 on the liquid crystal display panel 1 are hardly displaced. Thus, the second positioning marks 13 can be used as a part of electrodes of the liquid crystal display panel 1. Since widths of the transparent electrodes 12 in the first direction (A-direction) are not necessarily constant, it is possible to vary the width of each transparent electrode 12 corresponding to value of electric current flowing into the transparent electrode 12. A plurality (not limited to two) of the wiring electrodes 42 of the COF 4 may be connected to a wide transparent electrode 12, for example.

Figure 4A:
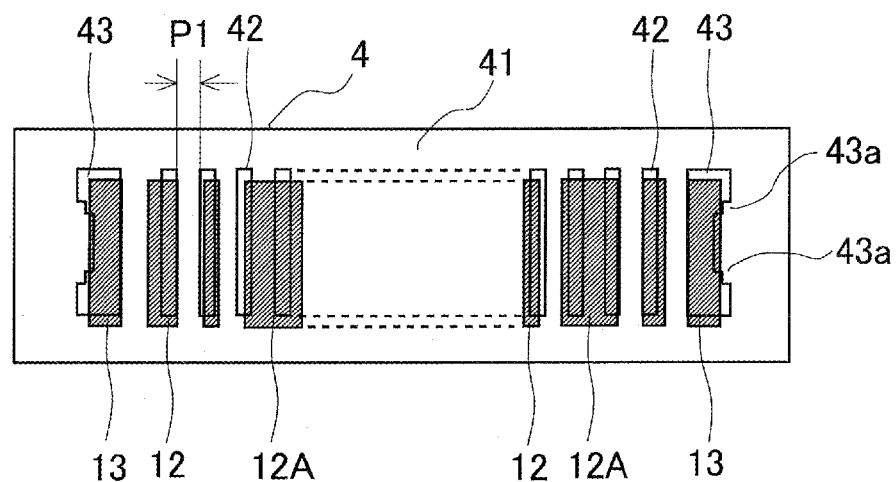
FIG. 4A is a view showing a state that the chip mounted circuit substrate is positioned on the liquid crystal display panel.
Figure 4B:
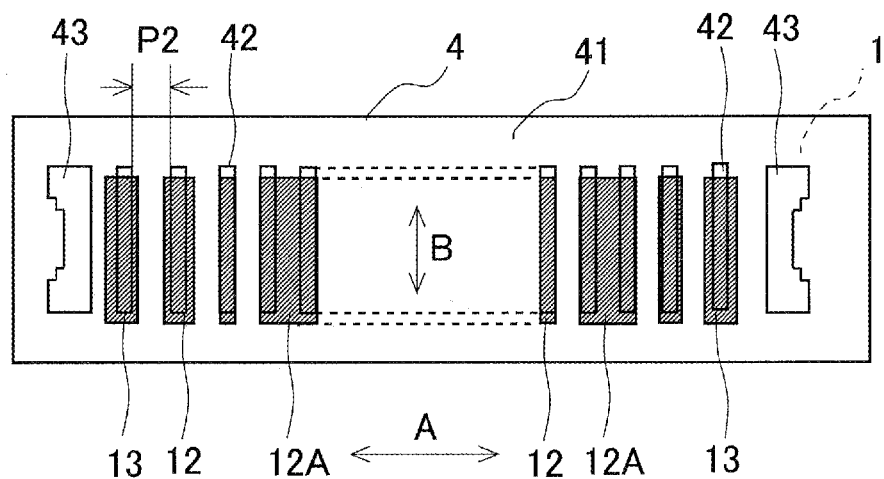
FIG. 4B is a view showing a state that the chip mounted circuit substrate is fixed on the liquid crystal display panel by thermo-compression bonding.

FIG. 4A shows a state that the COF 4 is positioned on the liquid crystal display panel 1, and FIG. 4B shows a state that the COF 4 is installed on the liquid crystal display panel 1 by the thermo-compression bonding. The outline of the liquid crystal display panel 1 is omitted from the illustration of FIGS. 4A and 4B. In the state before installing the COF 4 on the liquid crystal display panel 1 by the thermo-compression bonding as shown in FIG. 4A, the first positioning marks 43 are formed so that a part of each the first positioning mark 43 overlaps the second positioning mark 13 formed on the liquid crystal display panel 1 and protrudes outward from the second positioning mark 13 in the first direction (A-direction). Since the portion of the first positioning mark 43 protruding from the second positioning mark 13, that is, the stepped portion 43a is formed to be the steeped shapes, it is possible to use the stepped portion 43a as a scale. A worker can dispose the COF 4 on the liquid crystal display panel 1 using the scale so that quantities of protrusions of the first positioning marks 43 from the second positioning marks 13 in both sides in the first direction (A-direction) become substantially equal by manual labor with visual observation. In addition, positioning precision of the COF 4 on the liquid crystal display panel 1 in the second direction (B-direction) may be a little rough in comparison with that in the first direction (A-direction).

In the state shown in FIG. 4A, the thermo-compression bonding is performed from a central region of the COF 4 to both peripheral regions in the first direction (A-direction). Then, the base film 41 of the COF 4 expands in the first direction (A-direction) and in the second direction (B-direction) as shown in FIG. 4B, and the pitch of the arrangement of the wiring electrodes 42 of the COF 4 is expanded from the first pitch P1 to the second pitch P2 responding to the expansion of the base film 41, as shown in FIG. 4B. Consequently, one or more wiring electrodes 42 of the COF 4 is/are connected to each transparent electrode 12 of the liquid crystal display panel 1, as shown in FIG. 4B. Although the positions of the first positioning marks 43 of the COF 4 are displaced due to the expansion of the base film 41, the first positioning marks 43 are dummy electrodes which are not used as the wiring electrodes, so that the existence of the first positioning marks 43 causes no problem.

As mentioned above, according to the present invention, since two of the first positioning marks 43 of the COF 4 are formed larger to protrude from the second positioning marks 12 of the liquid crystal display panel 1, the worker can easily position the COF 4 on the liquid crystal display panel 1 before the thermo-compression bonding by disposing the COF 4 on the liquid crystal display panel 1 so that quantities of protrusions of the first positioning marks 43 from the second positioning marks in both sides in the first direction (A-direction) become substantially equal by manual labor with visual observation. In addition, since the portion of the first positioning mark 43 protruding from the second positioning mark 13 is formed to be stepped shapes, the stepped shaped portion can be used as a scale, and thus, the worker can easily make the quantities of protrusions of the first positioning marks 43 from the second positioning marks 13 in both sides in the first direction (A-direction) substantially equal. Moreover, the first pitch P1 of the arrangement of the wiring electrodes 42 of the COF 4 is made narrower/smaller that the second pitch P2 after installing the COF 4 on the liquid crystal display panel 1 in consideration of expansion of the base film 41 due to the thermo-compression bonding, so that the wiring electrodes 42 can be precisely connected to the transparent electrodes 12 of the liquid crystal display panel 1.

This application is based on Japanese patent application 2009-289276 filed Dec. 21, 2009 in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A liquid crystal display apparatus comprising a liquid crystal display panel, and a plurality of flexible printed circuit substrates which is fixed on the liquid crystal display panel by thermo-compression bonding, wherein
   the circuit substrate comprises wiring electrodes arranged in a first direction, and two of first positioning marks which are formed at both sides of an arrangement of the wiring electrodes in the first direction;
   the liquid crystal display panel comprises electrodes arranged at positions corresponding to the wiring electrodes, and two of second positioning marks formed at positions corresponding to the first positioning marks;
   each of the first positioning mark has a stepped portion formed to protrude outward from an arrangement of the electrodes of the liquid crystal display in the first direction; and
   the first positioning marks and the second positioning marks are formed so that the wiring electrode of the circuit substrate and the electrodes of the liquid crystal display will be connected at predetermined positions after the thermo-compression bonding when quantities of protrusions of the stepped portions of the first positioning marks from the second positioning marks in both sides in the first direction become substantially equal before the thermo-compression bonding.

2. The liquid crystal display apparatus in accordance with claim 1, wherein
   a pair of the stepped portions is formed at both ends of each of the first positioning marks in a second direction perpendicular to the first direction.

3. The liquid crystal display apparatus in accordance with claim 2, wherein
   the pair of the stepped portions formed at both ends of each of the first positioning marks have plural sets of sides facing each other and parallel to the first direction, and a distance in the second direction between each set of the sides facing each other and parallel to the first direction becomes longer responding to a quantity of protrusion in the first direction of the sides.

4. The liquid crystal display apparatus in accordance with claim 1, wherein
   the second positioning marks are used as a part of the electrodes of the liquid crystal display.

5. The liquid crystal display apparatus in accordance with claim 1, wherein
   the first positioning marks are dummy electrodes which are not used as the wiring electrodes of the circuit substrate.

6. The liquid crystal display apparatus in accordance with claim 2, wherein
   the second positioning marks are used as a part of the electrodes of the liquid crystal display.

7. The liquid crystal display apparatus in accordance with claim 2, wherein
   the first positioning marks are dummy electrodes which are not used as the wiring electrodes of the circuit substrate.

8. The liquid crystal display apparatus in accordance with claim 3, wherein
the second positioning marks are used as a part of the electrodes of the liquid crystal display.

9. The liquid crystal display apparatus in accordance with claim 3, wherein
the first positioning marks are dummy electrodes which are not used as the wiring electrodes of the circuit substrate.

10. A chip mounted circuit substrate comprising:
a plurality of wiring electrodes arranged on a base film at a first pitch in a first direction; and
two of first positioning marks formed at both sides of an arrangement of the wiring electrodes in the first direction, wherein
in a state before installing the chip mounted circuit substrate on a liquid crystal display panel by thermo-compression bonding,
the first pitch of the arrangement of the wiring electrodes is selected to be narrower than a second pitch of the arrangement of the wiring electrodes after installing the chip mounted circuit substrate on the liquid crystal display panel by thermo-compression bonding in consideration with expansion of the base film in the first direction due to the thermo-compression bonding,
the first positioning marks are formed so that a part of each the first positioning mark overlaps a second positioning mark formed on the liquid crystal display panel and protrudes outward from the second positioning mark in the first direction, and
the portions of the first positioning marks protruding from the second positioning marks are formed to have stepped shapes so that distances in a second direction perpendicular to the first direction between opposing two sides of the stepped shapes in parallel with the first direction become shorter in phase and each step of the stepped shapes is formed at a third pitch in the first direction.

* * * * *